(12) United States Patent
Kobayashi et al.

(10) Patent No.: US 6,776,874 B2
(45) Date of Patent: Aug. 17, 2004

(54) PROCESSING METHOD AND APPARATUS FOR REMOVING OXIDE FILM

(75) Inventors: Yasuo Kobayashi, Nirasaki (JP); Kotaro Miyatani, Kofu (JP); Kaoru Maekawa, Nakakoma-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/736,147

(22) Filed: Dec. 15, 2000

(65) Prior Publication Data

US 2001/0015261 A1 Aug. 23, 2001

Related U.S. Application Data

(60) Division of application No. 09/437,500, filed on Nov. 10, 1999, which is a continuation-in-part of application No. 09/086,574, filed on May 29, 1998, now abandoned.

(30) Foreign Application Priority Data

Jun. 4, 1997 (JP) .............................................. 9-161881
Nov. 11, 1998 (JP) ............................................ 10-320478

(51) Int. Cl.[7] ........................... H05H 1/00; C23C 16/00
(52) U.S. Cl. ............................. 156/345.51; 156/345.52; 156/345.53; 118/728; 118/724
(58) Field of Search ...................... 156/345.35, 345.36, 156/345.37, 345.34, 345.51, 345.52, 345.53; 118/719, 723 E, 723 ER, 723 MP, 723 MW, 728, 724

(56) References Cited

U.S. PATENT DOCUMENTS 4,123,663 A   10/1978  Horiike
4,192,706 A    3/1980  Horiike
4,615,756 A   10/1986  Tsujii et al.
4,687,544 A    8/1987  Bersin
4,689,112 A  *  8/1987  Bersin ........................ 156/345

(List continued on next page.)

FOREIGN PATENT DOCUMENTS

| EP | 0 376 252 | 7/1990 |
|---|---|---|
| EP | 0 887 845 | 12/1998 |
| GB | 2 276 764 A | 10/1994 |
| JP | 57-157525 | 9/1982 |
| JP | 59-61930 | 4/1984 |
| JP | 63-060529 | 3/1988 |
| JP | 2-256235 | 10/1990 |
| JP | 5-163097 | 6/1993 |
| JP | 5-306192 | 11/1993 |
| JP | 6-338478 | 12/1994 |
| JP | 7-263416 | 10/1995 |
| JP | 10-321610 | 12/1998 |

*Primary Examiner*—Parviz Hassanzadeh
(74) *Attorney, Agent, or Firm*—Oblon, Spivak, McClelland, Maier & Neustadt, P.C.

(57) ABSTRACT

A processing method and apparatus for removing a native oxide film from the surface of a subject to be treated, wherein plasma is generated from $N_2$ and $H_2$ gases and then activated to form an activated gas species, $NF_3$ gas is added to the activated gas species to generate an activated gas of these three gases, the subject is cooled to not higher than a predetermined temperature by a cooling means, gas generated from the $N_2$, $H_2$ and $NF_3$ gases is reacted with the surface of the subject to degenerate the native oxide film into a reactive film, the reactive film is sublimated and thus the native oxide film is removed if the subject is heated to a given temperature; a cluster system which includes the above apparatus and other apparatuses and which is capable of carrying a subject to be treated in an unreactive atmosphere.

19 Claims, 10 Drawing Sheets

U.S. PATENT DOCUMENTS

| | | | |
|---|---|---|---|
| 4,699,689 A | | 10/1987 | Bersin |
| 4,863,561 A | | 9/1989 | Freeman et al. |
| 4,988,644 A | | 1/1991 | Jucha et al. |
| 5,030,319 A | | 7/1991 | Nishino et al. |
| 5,134,965 A | | 8/1992 | Tokuda et al. |
| 5,226,056 A | * | 7/1993 | Kikuchi et al. ............. 156/345 |
| 5,273,609 A | * | 12/1993 | Moslehi ...................... 156/345 |
| 5,298,112 A | * | 3/1994 | Hayasaka et al. ........... 156/345 |
| 5,328,558 A | | 7/1994 | Kawamura |
| 5,403,434 A | * | 4/1995 | Moslehi ...................... 156/345 |
| 5,474,615 A | | 12/1995 | Ishida et al. |
| 5,616,208 A | * | 4/1997 | Lee ............................. 156/345 |
| 5,620,559 A | | 4/1997 | Kikuchi |
| 5,681,780 A | * | 10/1997 | Mihara et al. |
| 5,723,383 A | | 3/1998 | Kosugi et al. |
| 5,775,416 A | * | 7/1998 | Heimanson et al. ........ 165/275 |
| 5,919,336 A | | 7/1999 | Kikuchi et al. |
| 6,024,045 A | | 2/2000 | Kikuchi et al. |

* cited by examiner

PROCESSING METHOD AND APPARATUS FOR REMOVING OXIDE FILM

CROSS-REFERENCE TO RELATED APPLICATIONS

This is a division of appln. No. 09/437,500, filed Nov. 10, 1999, which is a Continuation-in-Part application of U.S. patent application No. 09/086,574, filed May 29, 1998 now abandoned, the entire contents of which are incorporated herein by reference.

BACKGROUND OF THE INVENTION

The present invention relates to a processing method and apparatus for removing an oxide film formed on a surface of an object and a contaminant to be treated mainly such as a semiconductor wafer, particularly, to a processing method and apparatus for removing a thin oxide film such as a native oxide film formed on a surface of the object such as a semiconductor wafer, and more particularly, to a processing method and apparatus for removing a native oxide film formed in a bottom portion of a fine hole formed on a surface of the object such as a semiconductor wafer.

The present invention is directed mainly to a technique of removing an oxide film formed on a surface of an object such as a semiconductor wafer, particularly, to a technique for removing a native oxide film. Although, the object to be processed in the present invention is not limited to a semiconductor wafer, the related art in relation to a technique for removing a native oxide film formed in a bottom portion of a fine hole formed on a surface region of a semiconductor wafer in order to specifically describing the related art is described.

As widely known to the art, processes to form a film on a semiconductor wafer used as a substrate and etching treatments to selectively etch the resultant film in a predetermined pattern are repeatedly carried out in the manufacture of a semiconductor integrated circuit on the semiconductor wafer. During these processes, the substrate is transferred among various processing devices. During the transfer, the substrate is exposed to the air atmosphere, with the result that the oxygen and water within the air atmosphere unavoidably cause a native oxide film to be formed on a surface of the substrate. Formation of the native oxide film causes the properties such as electrical properties of the film on a surface of the substrate to be deteriorated. Where deterioration of the film properties is undesirable in the process for forming a film on the substrate or in the etching process of the film, it is necessary to remove the native oxide film formed on the substrate.

A wet etching is one of the conventional techniques for removing the native oxide film. In the wet etching, the semiconductor substrate (wafer) having a native oxide film formed thereon is immersed in a washing liquid for removing the native oxide film. It should be noted that the line width of a wiring and the diameter of a contact hole formed in the semiconductor wafer are diminished with increase in the scale of integration and miniaturization of the semiconductor integrated circuit. For example, the diameter of the contact hole is 0.2 to 0.3 $\mu$m or less (e.g., 0.12 $\mu$m). What should be noted is that, since the contact hole has a very small diameter, the washing liquid is unlikely to enter sufficiently the contact hole. Also, the washing liquid once entering the contact hole is not likely to be easily expelled from within the contact hole because of the surface tension of the washing liquid. Under the circumstances, it is difficult for the washing liquid to remove sufficiently a native oxide film formed in a bottom portion of the contact hole.

Where the substrate is subjected to a wet washing, the wall of the contact hole is also etched together with the native oxide film. It should be noted in this connection that the contact hole extends through a plurality of layers formed on the substrate, with the result that the wall of the contact hole consists of a plurality of these layers. What should be noted is that these plural layers differ from each other in the etching rate when subjected to etching with the wet washing liquid. It follows that the surface of the contact hole is rendered irregular after the etching with the wet washing liquid. FIGS. 6A and 6B show in detail the situation. Specifically, FIG. 6A shows that a contact hole 2 for achieving an electrical contact with a drain or source region is formed in a surface region of a silicon substrate W. The contact hole 2, which has a diameter of about 0.2 to 0.3 $\mu$m, extends through three layers consisting of a $SiO_2$ $\lambda$1 layer 4 formed by thermal oxidation, a phosphorus-doped glass ($SiO_2$) $\lambda$2 layer 6 formed by a spin-coating method, and a silica glass ($SiO_2$) $\lambda$3 layer 8, as shown in the drawing. A native oxide film 10 is formed at the bottom of the contact hole 2. These $SiO_2$ layers 4, 6 and 8 slightly differ from each other in the etching rate when washed with a washing liquid. It follows that, if the native oxide film 10 is removed by the wet etching, the wall surface of the contact hole 2 is caused to be irregular by the difference in the etching rate noted above, as shown in FIG. 6B. In addition, the washing liquid tends to enter the boundary regions between the adjacent two layers, leading to an over-etching of the boundary regions.

To overcome the above-noted difficulties, it is proposed to employ a so-called dry etching method in place of the wet etching method for removing the native oxide film at the bottom of the contact hole. Japanese Patent Disclosure (Kokai) No. 2-256235 discloses a method of removing a native oxide film by utilizing a $NF_3$ gas (halogen gas) or $NH_3$ gas (basic gas). It is disclosed that the halogen gas or the basic gas noted above is introduced into a process chamber, and the native oxide film is removed by plasma formed within the process chamber. In this technique, however, required is an apparatus for exhausting these two kinds of the special gases ($NF_3$, $NH_3$) leading to a high operating cost. Japanese Patent Disclosure No. 6-338478 discloses another technique. It is disclosed that an $H_2$ gas and an $H_2O$ vapor are supplied into a plasma generating section for activation of these gas and vapor. Then, an $NF_3$ gas or a gaseous mixture containing $NF_3$ gas is added to the activated gas and vapor for removing the native oxide film. However, since $H_2O$ (steam) is used in this technique, a native oxide film tends to be formed in an amount larger than the amount of the removed native oxide film. As a matter of fact, a native oxide film was not sufficiently removed in the experiment conducted by the present inventor.

In order to resolve the above drawback of the conventional wet cleaning, a method of removing a native oxide film from a subject to be treated using etching gas, i.e., a so-called dry cleaning (etching) method is proposed in, for example, Jpn. Pat. Appln. KOKAI Publication Nos. 5-275392, 6-338478, and 9-106977.

FIG. 14 shows a prior art dry etching apparatus for dry-etching an $SiO_2$ film by the dry cleaning method as disclosed in the above No. 5-275392 Publication. The dry cleaning method for eliminating a native oxide film from a subject to be treated, will now be described with reference to FIG. 14 showing the dry etching apparatus. In the apparatus shown in FIG. 14, an open/close valve 450 is closed to cut off Ar gas from an Ar-gas source 454. Open/close valves 436 and 438 are opened to supply $NF_3$ gas and $H_2$ gas from an $NF_3$-gas source 444 and an $H_2$-gas source 446 to a pipe 432 by controlling their flow rates by means of flow-rate controllers (MFC) 440 and 442. In the pipe 432, both the $NF_3$ gas and $H_2$ gas are mixed at a mixing ratio of 1:2 into a mixed gas having a total pressure of 0.2 Torr. A 2.45-GHz-frequency, 50-w-power microwave is supplied from a magnetron into the pipe 432 via a microwave waveguide 448, and the mixed gas thus becomes plasma therein. A fluorine active species $F^*$, a hydrogen active species $H^*$, and a nitrogen active species $N^*$, which are generated by the plasma, move toward a chamber 410 within the pipe 432 and enter a buffer chamber 430 of the chamber 410. These species are then supplied downstream onto a wafer W placed on a susceptor 412 through a porous plate 428. The wafer W is cooled by a chiller which is supplied from a chiller supply unit 418 and cooled to not higher than room temperature. The active species $F^*$, $H^*$ and $N^*$ supplied to the cooled wafer W, are adsorbed by the native oxide film on the surface of the wafer W and react to SiO into a product. This product is vaporized and exhausted from an exhaust hole 460 provided at the bottom of the chamber 410 by a vacuum pump 466.

In the foregoing prior art method of removing a native oxide film from the surface of a cooled wafer by fluorine, hydrogen and nitrogen active species $F^*$, $H^*$ and $N^*$ generated by plasma, which is disclosed in Jpn. Pat. Appln. KOKAI Publication No. 5-275392, $NF_3$ is changed into plasma and thus dissolved into fluorine and nitrogen active species $F^*$ and $N^*$, so that no $NF_3$ active gas can be generated efficiently. Since, moreover, $H_2$ gas has difficulties in maintaining the plasma state by itself, it is difficult to secure an etching rate enough to eliminate the native oxide film.

In another method of eliminating a native oxide film by dry cleaning, which is disclosed in Jpn. Pat. Appln. KOKAI Publications Nos. 6-338478 and 9-106977, it is difficult to secure an etching rate enough to remove a native oxide film since $H_2$ gas is used alone.

The present invention aims at resolving the above problems or drawbacks of the prior art method of removing an oxide film such as a native oxide film. According to the present invention, in order to remove an oxide film having a thickness of 10 Å to 20 Å from the surface of a subject to be treated, $H_2$ gas and $N_2$ gas are mixed into plasma gas, and $NF_3$ gas (reactive gas) is added to the plasma gas during the flow of active species of the mixed gas. The subject is cooled to not higher than room temperature, and the oxide film on the subject reacts with the reactive gas to form a reactive film. After that, the subject to be treated is heated to a given temperature or higher, and the reactive film is removed from the surface of the subject.

BRIEF SUMMARY OF THE INVENTION

An object of the present invention, which has been achieved in an attempt to solve the above-noted problems, is to provide a method and apparatus for effectively removing an oxide film formed on a surface of an object mainly such as a semiconductor wafer.

Another object is to provide a method and apparatus for effectively removing a native oxide film formed on a surface of an object mainly such as a semiconductor wafer.

Another object is to provide a processing method and apparatus, which do not require a high cost for disposing of an exhaust gas.

Another object is to provide a method and apparatus for effectively removing a native oxide film without newly forming a native oxide film.

Further, still another object of the present invention is to provide a method and apparatus for effectively removing a native oxide film formed at a bottom portion of a fine hole formed in a surface region of an object such as a semiconductor wafer.

Further, still another object of the present invention is to provide a cluster system wherein at least one metal-wiring forming chamber is provided in the above apparatus such that a subject to be treated can be carried in an unreactive atmosphere.

According to a first aspect of the present invention, there is provided a method of removing an oxide film formed on a surface of an object to be processed, comprising the steps of:

forming an activated gas from a $N_2$ gas, $H_2$ gas and $NF_3$ gas;

exposing a surface of the object to the activated gas to bring about a reaction between the activated gas and an oxide film formed on a surface of the object, thereby forming a reaction film; and heating the object to a predetermined temperature so as to sublimate the reaction film.

Preferably, the oxide film to be removed by the above method is a native oxide film.

Preferably, in the above method, the formation of the activated gas from the $N_2$ gas, $H_2$ gas and $NF_3$ gas comprises the steps of forming a plasma of a mixed gas consisting of the $N_2$ gas and $H_2$ gas and also forming active species, and supplying the $NF_3$ gas into the active species so as to form activated gases of the $N_2$ gas, $H_2$ gas and $NF_3$ gas.

Preferably, in the above method, the formation of a plasma of a mixed gas consisting of the $N_2$ gas and $H_2$ gas is carried out in a quartz-made plasma generating section by introducing a microwave into a mixed gas of the $N_2$ gas and $H_2$ gas supplied to the plasma generating section.

Preferably, in the above method, the predetermined temperature is 100° C. or higher.

Preferably, in the above method, the processing using an activated gas is executed in room temperature and, after a supply of the activated gas is stopped, the reaction film is sublimated by heating the object to a predetermined temperature.

According to a second aspect of the present invention, there is provided a processing apparatus for removing an oxide film, comprising:

a susceptor on which an object to be processed is disposed;

a process chamber housing said susceptor; and a mechanism for removing oxide films formed on a surface of the object;

wherein said mechanism for removing the oxide films include:

an activated gas forming device for forming an activated gas from $N_2$ gas, $H_2$ gas and $NF_3$ gas;

an introducing device for introducing the activated gas formed in said activated gas forming device onto a surface of the object disposed on said susceptor arranged within said process chamber; and a heating device for heating the object to temperatures at which reaction films resulting from reaction between the oxide films formed on the surface of the object and the activated gas introduced into the process chamber are sublimated.

Preferably, in the above processing apparatus, said activated gas forming device includes:

a plasma generating device for converting the supplied gas into plasma;

a gas supply device for supplying $N_2$ gas and $H_2$ gas into said plasma generating device;

an activated species forming device for converting the plasma generated from the plasma generating device into activated species; and an activated gas forming device for supplying an $NF_3$ gas into the activated species of $N_2$ gas and $H_2$ gas formed in said activated species forming device so as to form activated gases of $N_2$ gas $H_2$ gas and $NF_3$ gas.

Preferably, in the above processing apparatus, the oxide film formed on the surface of the object is a native oxide film formed by the reaction with the air atmosphere during the predetermined process steps applied to the object.

Preferably, in the above processing apparatus, said activated gas forming device includes:

a plasma generating device for converting the supplied gas into plasma;

a gas supply device for supplying $N_2$ gas and $H_2$ gas into said plasma generating device;

an activated species forming device for converting the plasma generated from the plasma generating device into activated species; and an activated gas forming device for supplying an $NF_3$ gas into the activated species of $N_2$ gas and $H_2$ gas formed in said activated species forming device so as to form activated gases of $N_2$ gas $H_2$ gas and $NF_3$ gas, and wherein the heating device for heating the object is for heating the object to temperatures at which the native oxide films formed on the surface of the object react with the activated gas introduced into the process chamber and the resultant reaction films are sublimated.

Preferably, in the above processing apparatus, said plasma generating device is equipped with a mechanism for converting a gas into a plasma by utilizing a microwave.

Preferably, in the above processing apparatus, said activated gas forming device includes:

a pipe made of microwave transmitting material; and a supply section of a microwave and a supply section of an $N_2$ gas and $H_2$ gas formed at the inlet port of said pipe.

Preferably, in the above processing apparatus, an introducing mechanism for introducing said activated gas onto the surface of the object disposed on the susceptor arranged in the process chamber includes a guide arranged at the outlet port of said activated species forming device for guiding the activated gases of the $N_2$ gas, $H_2$ gas and $NF_3$ gas onto the surface of the object.

Preferably, in the above processing apparatus, those walls of said activated gas forming device, said introducing mechanism and said process chamber which are brought into contact with said activated gas are formed of an electrically insulating material.

Preferably, in the above processing apparatus, said heating device heats said susceptor so as to elevate the temperature of the object disposed on the susceptor to temperatures at which said reaction films are sublimated.

According to a third aspect of the present invention, there is provided a surface treatment method comprising the steps of:

carrying a subject to be treated, which has an oxide on a surface thereof, into a treatment vessel;

evacuating the treatment vessel to produce a vacuum;

introducing gas containing N and H gases into a plasma generation section, generating plasma from the gas, and activating the plasma to form an activated gas species of N and H gases;

causing the activated gas species to flow toward the subject and adding an $NF_3$ gas to the activated gas species to generate an activated gas of $NF_3$ gas;

cooling the subject to not higher than a predetermined temperature; and reacting the activated gas of $NF_3$ gas with the oxide on the surface of the subject to degenerate the oxide into a reactive film.

Preferably, in the above surface treatment method, the gas containing N and H gases is a mixture gas of $N_2$ and $H_2$ gases, and the method further comprises the steps of:

stopping supply of $N_2$, $H_2$ and $NF_3$ gases into the treatment vessel and heating the subject to a predetermined temperature to sublimate the reactive film, after the step of degenerating the oxide into the reactive film; and stopping evacuation of the treatment vessel and taking the subject, from which an oxide film is removed, out of the treatment vessel.

According to a fourth aspect of the present invention, there is provided a surface treatment method comprising the steps of:

carrying a subject to be treated, which has an oxide on a surface thereof, into a treatment vessel;

evacuating the treatment vessel to produce a vacuum;

introducing gas containing N and H gases into a plasma generation section, generating plasma from the gas, and activating the plasma to form an activated gas species of N and H gases;

causing the activated gas species to flow toward the subject and adding an $NF_3$ gas to the activated gas species to generate an activated gas of $NF_3$ gas;

cooling the subject to not higher than a predetermined temperature; and reacting the activated gas of $NF_3$ gas with the oxide on the surface of the subject to degenerate the oxide into a reactive film.

Preferably, in the above surface treatment method, the gas containing N and H gases is a mixture gas of $N_2$ and $H_2$ gases, and the method further comprises the steps of:

stopping supply of $N_2$, $H_2$ and $NF_3$ gases into the treatment vessel and heating the subject to a predetermined temperature to sublimate the reactive film, after the step of degenerating the oxide into the reactive film; and stopping evacuation of the treatment vessel and taking the subject, from which an oxide film is removed, out of the treatment vessel.

Preferably, in the above surface treatment method, the predetermined temperature at which the subject is cooled, is not higher than room temperature.

Preferably, in the above surface treatment method, the predetermined temperature at which the subject is cooled, ranges from 20° C. to −20° C.

Preferably, in the above surface treatment method, the predetermined temperature at which the subject is cooled, ranges from 10° C. to −20° C.

Preferably, in the above surface treatment method, the predetermined temperature at which the reactive film is sublimated, is not lower than 100° C.

According to a fifth aspect of the present invention, there is provided a surface treatment apparatus comprising:

a plasma generation section for generating plasma from a plasma generating gas;

a treatment vessel connected to the plasma generation section and including a susceptor on which a subject to be treated is placed;

cooling means for cooling the subject placed on the susceptor to a predetermined temperature;

lifting means for lifting the subject to a heating position in the treatment vessel; and heating means for heating the subject to a predetermined temperature in the heating position.

Preferably, the above surface treatment apparatus is an apparatus for removing a native oxide film from a surface of the subject to be treated.

Preferably, the above surface treatment apparatus further comprises:

a plasma generating gas introduction section for introducing $N_2$ and $H_2$ gases to the plasma generation section as a plasma generating gas; and an $NF_3$-gas supply section for adding an $NF_3$ gas to an activated gas species of $N_2$ and $H_2$ gases activated by the plasma generation section and caused to flow toward the subject to be treated, and an activated gas of $NF_3$ gas is generated by adding the $NF_3$ gas to the activate gas species, and the activated gas is reacted with a surface layer of the subject to degenerate the surface layer.

Preferably, in the above surface treatment apparatus, the predetermined temperature at which the subject placed on the susceptor is cooled, is not higher than room temperature.

Preferably, in the above surface treatment apparatus, the predetermined temperature at which the subject placed on the susceptor is cooled, ranges from 20° C. to −20° C.

Preferably, in the above surface treatment apparatus, the predetermined temperature at which the subject placed on the susceptor is cooled, ranges from 10° C. to −20° C.

Preferably, in the above surface treatment apparatus, the predetermined temperature at which the subject is heated at the heating position, is not lower than 100° C.

Preferably, in the above surface treatment apparatus, the $NF_3$-gas supply section includes a number of gas exhaust holes formed in an inner wall of the treatment vessel.

Preferably, in the above surface treatment apparatus, the $NF_3$-gas supply section includes a shower head having a number of gas exhaust holes provided in the treatment vessel.

Preferably, in the above surface treatment apparatus, the $NF_3$-gas supply section supplies the $NF_3$ gas to the activate gas species in position at least 20 cm away from an end of the plasma generation section in a direction of the subject to be treated.

Preferably, in the above surface treatment apparatus, the heating means is heat radiation means provided above the subject to be treated.

Preferably, in the above surface treatment apparatus, the heating means is a heating lamp provided above the subject to be treated.

According to a sixth aspect of the present invention, the above surface treatment apparatus comprises a cluster system including at least one metal-wiring forming chamber, a heating chamber, and a load-lock chamber such that the subject is carried through a carrier chamber in an unreactive atmosphere.

According to a seventh aspect of the present invention, the above surface treatment apparatus comprises a cluster system including at least one metal-wiring forming chamber, a heating chamber, a cooling chamber, and a load-lock chamber such that the subject is carried through a carrier chamber in an unreactive atmosphere.

Preferably, in the above cluster system, the metal-wiring forming chamber is a chamber for forming a film of at least one of Al, Ti, TiN, Si, W, WN, Cu, Ta, TaN and SiN.

Preferably, in the above cluster system, the metal-wiring forming chamber includes means for heating the subject to a temperature of 100° C. or higher.

BRIEF DESCRIPTION OF THE SEVERAL VIEWS OF THE DRAWING

The accompanying drawings are related to and constitute a part of the specification and exemplifies a preferred embodiment of the present invention, wherein.

DESCRIPTION OF THE INVENTION

The present invention is directed mainly to a technique of removing an oxide film formed on a surface of an object such as a semiconductor wafer, particularly, to a technique for removing a native oxide film. Although the object to be processed in the present invention is not limited to a semiconductor wafer, in order to specifically describing a preferred embodiment of the present invention, the present invention in relation to a technique for removing a native oxide film formed in a bottom portion of a fine hole formed on a surface region of a semiconductor wafer is described.

Figure 1:
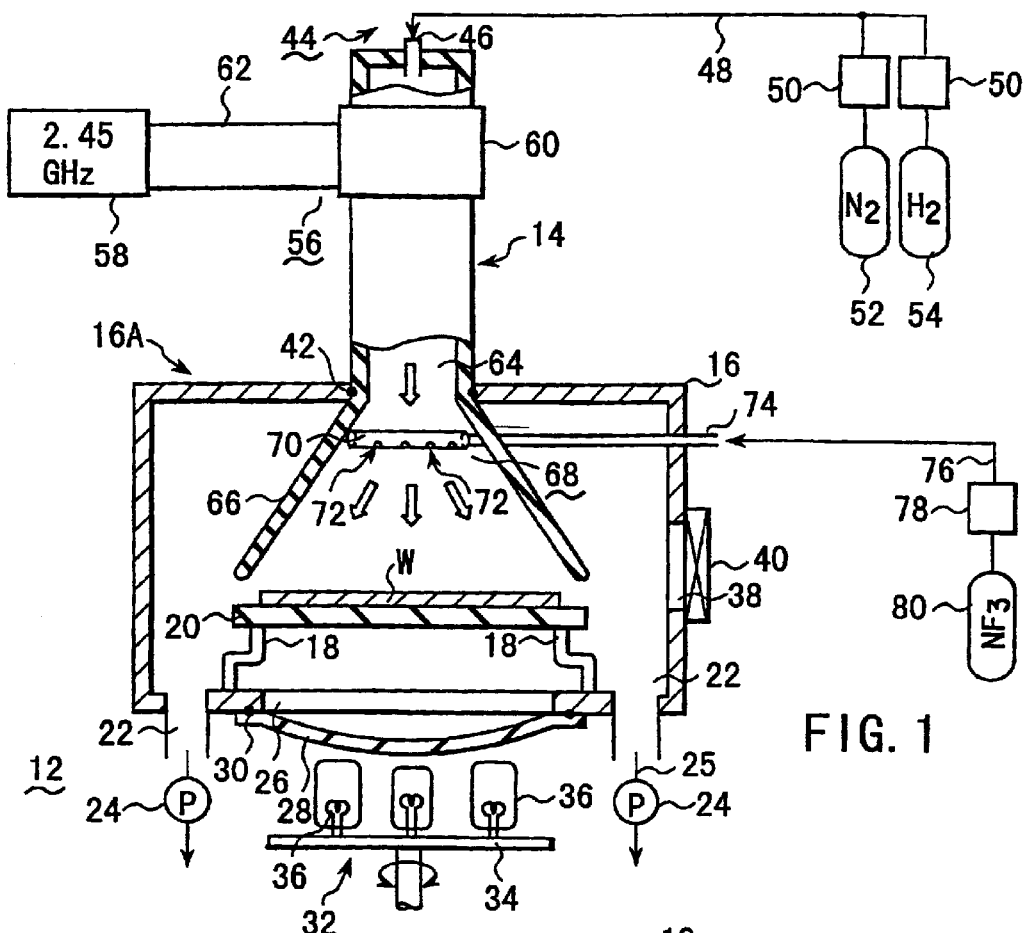
FIG. 1 shows the construction of a processing apparatus according to one embodiment of the present invention.
Figure 2:
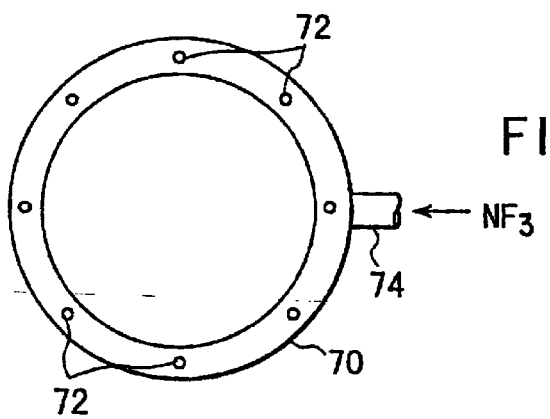
FIG. 2 is a plan view showing an $NF_3$ gas supply section.

FIG. 1 shows the construction of a processing apparatus 12 of the present invention, and FIG. 2 is a plan view showing a supply section of an $NF_3$ gas. As shown in the drawings, the processing apparatus 12 comprises a microwave generating source 58, waveguides 60, 62, a gas introducing section 44 for introducing a mixed gas of an $N_2$ gas and $H_2$ gas, a pipe 14 for forming a plasma and active species, and a process chamber 16 in which a native oxide film formed on an object (semiconductor wafer) is removed. The microwave formed in the microwave generating source 58 is supplied through the waveguides 62, 60 and the pipe 14 for forming a plasma and active species. Within the pipe 14, the mixed gas of the $N_2$ gas and $H_2$ gas is converted into a plasma so as to form active species. The process chamber 16 is in the form of a cylinder made of, for example, aluminum. A susceptor 20 made of, for example, SiC is supported by supporting rods 18 made of, for example, quartz. Formed in a bottom portion of the process chamber 16 is an exhaust port 22, which is connected to an exhaust system 25 equipped with a vacuum pump 24, etc. for evacuating the process chamber 16. An opening 26 equal in size to the susceptor 20 is formed below the susceptor 20. A heat ray transmitting member 28 made of, for example, quartz is hermetically attached to close the opening 26 using a sealing member 30. The heat ray transmitting member 28 is shaped arcuate in cross section in a manner to bend downward in the central portion.

A heating means 32 is arranged below the heat ray transmitting member 28 such that the susceptor 20 is heated from the back side. The heating means 32 includes a plurality of heating lamps 36, e.g., halogen lamps, mounted on a rotatable plate 34. The heat emitted from the heating means is transmitted through the heat ray transmitting member 28 so as to be incident on the back surface of the susceptor. Incidentally, heating means other than the heating lamps 36 shown in the drawing can also be used in the present invention. For example, it is possible to mount an electric heater within the susceptor 20. Further, a semiconductor wafer transfer port 38 and a gate valve 40 are formed in a side wall of the process chamber 16.

The pipe 14 for forming a plasma and active species, which is made of an electrically insulating and microwave transmitting material such as quarts, is hermetically mounted to close an upper opening in a ceiling portion 16A of the process chamber 16 using a sealing member 42. Also, the pipe 14 extends through the waveguide 60. The gas introducing section 44 is mounted on the upper end of the pipe 14 such that a mixed gas of an $N_2$ gas and an $H_2$ gas is introduced through the gas introducing section 44 and the waveguide 60 into the pipe 14. The gas introducing section 44 includes an introducing nozzle 46, which is connected to a gas passageway 48. The gas passageway 48 is connected to a two-way branched tube, one of the branches being connected to an $N_2$ gas source 52 via a flow rate controller 50, e.g., mass flow controller, and the other branch being connected to an $H_2$ gas source 54 via another flow rate controller 50.

The microwave having a frequency of, for example, 2.45 GHz, which is generated in the microwave generating source 58, is supplied through the waveguide 62 having, for example, a rectangular cross section, and the other waveguide 60, e.g., an Evenson type microwave, into the pipe 14 for forming a plasma and active species. The mixed gas of the $H_2$ gas and $N_2$ gas is converted into a plasma within the pipe 14 under the action of the microwave so as to form active species of N* from $N_2$ and H* from $H_2$.

An $NF_3$ gas supply section 68 is formed in a lower portion of an outlet port 64 of the pipe 14 so as to supply an $NF_3$ gas into the active species. The $NF_3$ gas is supplied from an $NF_3$ gas source 80 into a ring-like shower head 70 made of quartz through a flow rate controller 78, e.g., mass flow controller, a gas passageway 76 and a communicating pipe 74. Then, the $NF_3$ gas is added through a gas holes 72 to the active species. As a result, the $NF_3$ itself is also activated by the active species.

A guide member 66 made of quartz and downwardly flared or shaped conical is mounted to the outlet port 64 of the pipe 14 so as to permit the activated gases to be supplied uniformly onto an object to be treated.

Figure 3A:
FIGS. 3A to 3C show the processing steps of a processing method of the present invention.
Figure 6A:
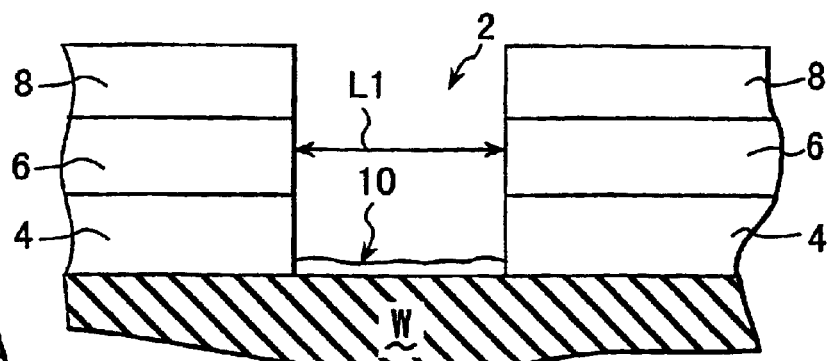
FIGS. 6A and 6B are directed to a conventional method for removing a native oxide film.
Figure 6B:
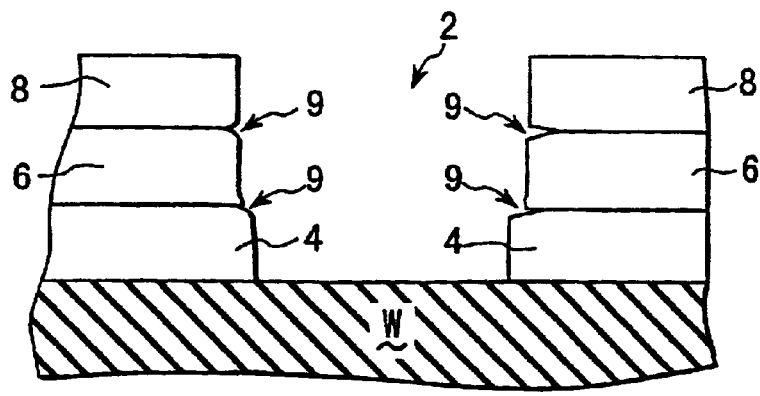

The processing method of the present invention is worked by using the processing apparatus of the construction described above. Specifically, an object W (silicon wafer) is introduced into the process chamber 16 through the gate valve 40, which is opened, and disposed on the susceptor 20. The contact hole 2 as shown in FIG. 6A is formed in advance in a surface region of the silicon wafer W. As described previously, a native oxide ($SiO_2$) film 10 is formed in a bottom of the contact hole 2. FIG. 3A shows in a magnified fashion the native oxide film 10 formed in the bottom of the contact hole 2.

After introduction of the wafer W, the gate valve 40 of the process chamber 16 is closed to make the process chamber hermetic. Under this condition, the process chamber is evacuated to establish a vacuum condition. Then, the $N_2$ gas and $H_2$ gas are introduced at predetermined flow rates from the $N_2$ gas source 52 and the $H_2$ gas source 54 into the pipe 14 for forming a plasma and active species through the plasma gas introducing section 44. Also, the microwave having a frequency of, for example, 2.45 GHz, which is generated in the microwave generating source 58, is introduced into the pipe 14 through the waveguides 62 and 60. Within the pipe 14, the $N_2$ gas and the $H_2$ gas are converted by the microwave into a plasma and, activated to form active species. Since the process chamber 16 is held vacuum, these active species are moved toward the outlet port 64 of the pipe 14.

Figure 3B:
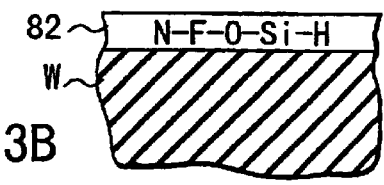

Further, the $NF_3$ gas supplied from the $NF_3$ gas source 80 is added through the ring-like shower head 70 of the $NF_3$ gas supply section 68 to the active species of the mixed gas of the $H_2$ gas and $N_2$ gas, with the result that the $NF_3$ gas is also activated by the active species so as to form a mixture of these activated gases. The mixture is effectively guided uniformly by the guide member 66 toward the wafer W so as to be brought into contact with the wafer W. As a result, the active species react with the native oxide film on the wafer W to cause the native oxide film to be modified into a reaction film 82 in which Si, N, H, F and O are mixed together, as shown in FIG. 3B. The reaction film 82 also serves to prevent the silicon wafer W itself from being etched with the activated gases. During this treatment, the wafer W is not heated, and is put under room temperature to cause the activated gases to reach a bottom of the contact hole effectively.

For example, the flow rates of the $H_2$ gas, $N_2$ gas, and $NF_3$ gas may be set at 20 sccm, 30 sccm and 200 sccm, respectively. The process pressure may be set at 3 Torr, the plasma power may be set at 150 W, and the process time may be set at 3 minutes.

As described previously, the downwardly flared guide member 66 is arranged above the susceptor 20, with the result that scattering of the activated gases is suppressed by the guide member 66. It follows that the activated gases flow effectively toward the wafer so as to perform reaction with the native oxide film formed on the wafer W.

After formation of the reaction film 82, the supply of the $H_2$ gas, $N_2$ gas and $NF_3$ is stopped. Also stopped is the operation of the microwave generating source 58. Then, the process chamber 16 is evacuated to discharge the gases remaining within the process chamber 16 to the outside. Under this condition, the susceptor 20 is heated from the back surface by the heating means 32 so as to elevate the temperature of the wafer W disposed on the susceptor 20 to a predetermined level, e.g., at least 100° C. By this heating, a molecule 84 containing Si, N, H, F and O is sublimated so as to be scattered. As a result, the native oxide film 10 is removed from the wafer W to expose the Si substrate to the outside at the bottom of the contact hole. The heat treatment for removing the native oxide film 10 is carried out under a pressure of 1 mTorr or less for about 2 minutes.

The mechanism of the native oxide film removal described above has not yet been clarified sufficiently. However, it is considered reasonable to understand that the activated gases of $H_2$ gas, $N_2$ gas and $NF_3$ gas react with the native oxide film ($SiO_2$) to form a large molecule containing Si, N, H, F and O. To be more specific, N, F and H are considered to be interposed between O and Si so as to be bonded each other, and the resultant product is considered to be readily sublimated under heat of at least 100° C. while maintaining a molecular form of N—F—H—O—Si.

Figure 4A:
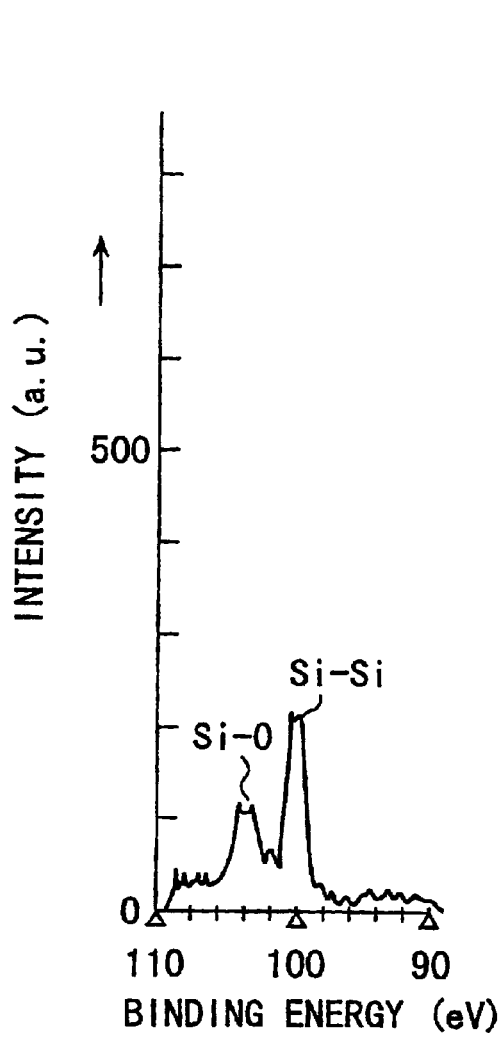
FIG. 4A is a graph showing the result of an elemental analysis on a surface of an object before processing by the method of the present invention.
Figure 4B:
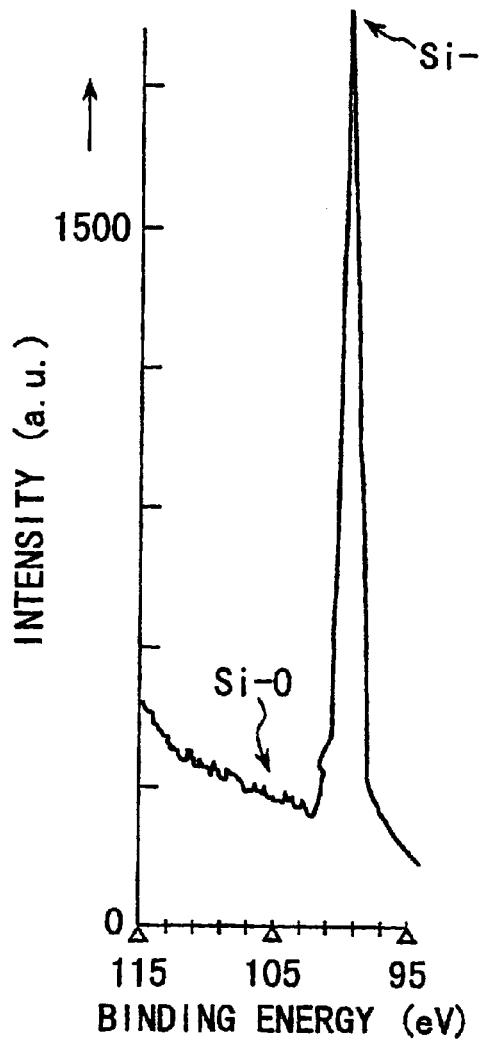
FIG. 4B is a graph showing the result of an elemental analysis on a surface of an object after processing by the method of the present invention.

The atoms on the surface of the wafer W thus treated were analyzed by a surface elemental analysis apparatus (XPS, i.e., X-ray Photoelectron Spectroscopy), with the result as shown in FIGS. 4A and 4B. FIG. 4A shows the analytical result of the surface of the semiconductor wafer before the treatment, with FIG. 4B showing the analytical result of the wafer after the treatment of the present invention. As shown in FIG. 4A, a peak of the intensity is recognized in the vicinity of 104 eV of the binding energy, which denotes the Si—O bond, in addition to another peak in the vicinity of 99 eV of the binding energy denoting the Si—Si bond before the process of the present invention. After the process of the present invention, however, a peak is not recognized in the vicinity of 104 eV of the binding energy, which denotes the Si—O bond, though another peak is recognized in the vicinity of 99 eV of the binding energy denoting the Si—Si bond, as shown in FIG. 4B. This clearly supports that the native oxide film ($SiO_2$) has been completely removed by the treatment of the present invention.

Various experiments have been conducted by changing the process pressure and temperature in sublimating the reaction film 82. It has been found that the lower limit of the process temperature has been found to be about 100° C. If the process temperature was lower than about 100° C., the reaction film 82 was not sufficiently sublimated.

If the native oxide film is removed by the conventional wet washing, the surface of the object after removal of the native oxide film is relatively roughened. However, the surface of the object after removal of the native oxide film by the method of the present invention is rendered flat, compared with the wet washing. It follows that the contact area between the wafer surface after removal of the native oxide film and the surface of the wiring fixed to the wafer surface is increased, leading to a stronger bonding between the two.

Figure 7:
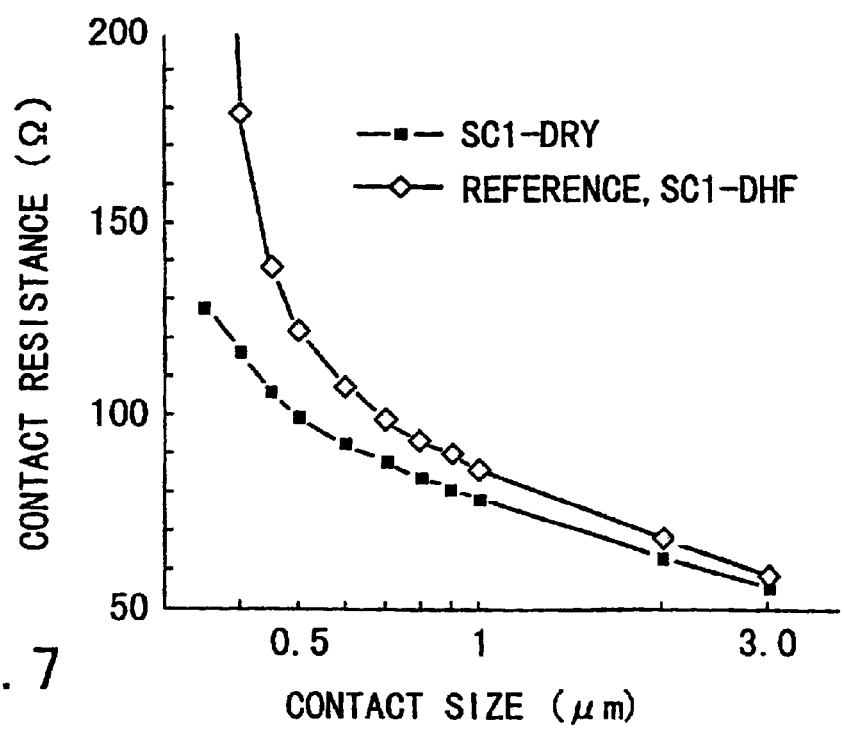
FIG. 7 is a graph showing the relationship between the contact resistance and the contact size.

Additional experiments have been conducted in an attempt to confirm the effect produced by the present invention. In these experiment, used as samples were silicon substrates each having a silicon oxide film formed thereon. A contact hole was formed in the silicon oxide film. Further, a doped polycrystalline silicon (polysilicon) wiring was buried in the contact hole for electrical connection to the silicon substrate. Before formation of the polysilicon film, the sample was washed with a washing solution as a pretreatment in order to remove mainly particles. The washing solution consisted of ammonia water, hydrogen peroxide solution, and pure water mixed at a ratio of 1:2:10. The washing treatment was carried out at 60° C. for 10 minutes. Further, each of the samples was washed with water and, then, dried, followed by dividing the samples into a group of comparative samples and another group of samples to which the method of the present invention was applied. These comparative samples were etched with an etching solution consisting of hydrofluoric acid and pure water mixed at a ratio of 1:99. The etching treatment was carried out at room temperature for 10 minutes. The other samples for the present invention were subjected to a dry treatment under the conditions described previously. FIG. 7 shows the experimental data in respect of the contact resistance relative to various contact sizes. The comparative samples are denoted by an SCI-DFH curve in FIG. 7, with the samples for the present invention being denoted by an SCI-DRY curve. The expression "SCI" represents the washing pretreatment which was commonly employed in both the comparative samples and the samples for the present invention. As apparent from FIG. 7, the samples treated by the method of the present invention were lower in the contact resistance than the comparative samples. In addition, the difference in the contact resistance between the comparative samples and the samples for the present invention was prominently increased with decrease in the contact size.

As described above, the processing method and apparatus of the present invention permit removing a native oxide film formed at a bottom of a fine contact hole without using a washing liquid as in the wet washing method. It should also be noted that an $NH_3$ gas is not used in the present invention, making it possible to disuse an exhaust gas processing apparatus for processing the $NH_3$ gas. It follows that the facility cost and the operating cost can be reduced in the present invention.

In the present invention, activated gases are formed from an $N_2$ gas, $H_2$ gas and $NF_3$ gas. A surface of an object is exposed to these activated gases to bring about a reaction between these activated gases and an oxide film to be removed, particularly a native oxide film formed on the surface of the object. As a result, the oxide film is converted into a reaction film, which is then sublimated by the heating of the object to a predetermined temperature. It should also be noted that, in the present invention, a mixed gas of an $N_2$ gas and $H_2$ gas is converted into a plasma and active species are formed. Further, the $NF_3$ gas is added to the active species so as to form activated gases of the $N_2$ gas, $H_2$ gas and NF$_3$ gas. Additional features of the present invention are as already described herein before.

It is of no difficulty for those skilled in the art to arrive at various modifications based on the embodiment of the present invention described above. Of course, these modifications fall within the technical scope of the present invention. In other words, the technical scope of the present invention is not limited to the typical embodiment described herein in detail. Needless to say, various modifications are conceivable within the technical scope defined in the appended claims.

Figure 5:
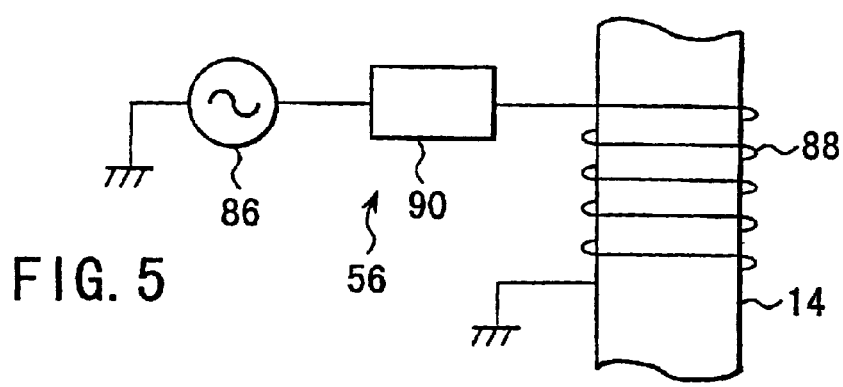
FIG. 5 shows a modification of the plasma forming section.

For example, a plasma forming section 56 included in the processing apparatus of the present invention is equipped with the microwave generating source 58, the Evenson type waveguide 60, etc., as shown in FIG. 1. The plasma forming section 56 of the particular construction is efficient for forming a plasma of a mixed gas consisting of N$_2$ gas and H$_2$ gas. However, it is also possible to substitute the plasma forming section 56 constructed as shown in FIG. 5 for the plasma forming-section shown in FIG. 1. To be more specific, the plasma forming section 56 shown in FIG. 5 comprises a high frequency generating source 86 generating RF (Radio Frequency) of 13.56 MHz and a induction coil 88 wound about a part of the pipe 14 for forming plasma and active species. Further, a matching circuit 90 is connected between the induction coil 88 and the high frequency generating source 86 so as to achieve the impedance matching therebetween. In this case, a plasma is formed by an inductive coupling upon supply of an RF wave to the induction coil 88, with the result that the function and effect similar to those in the embodiment described previously are exhibited.

The flow rates of the various gases described previously are no more than examples and, thus, do not limit the technical scope of the present invention.

In the embodiment described previously, the flow rates of the H$_2$ gas, N$_2$ gas and NF$_3$ gas are set at 20 sccm, 30 sccm and 200 sccm, respectively. However, it is possible to double these flow rates or to set the flow rates at levels higher than double of these flow rates.

Also, in the embodiment described previously, the shower head 70 for supplying the NF$_3$ gas is mounted to the outlet port 64 of the pipe 14 for forming plasma and active species. However, the mounting position of the shower head 70 is not limited to the outlet port 64 noted above. To be more specific, the shower head 70 can be mounted anywhere as far as the mounting position is closer to the object than the waveguide 60. In this case, it is important to add the NF$_3$ gas to an atmosphere of active species converted from the plasma, not to the plasma of a mixed gas consisting of H$_2$ gas and N$_2$ gas. If NF$_3$ is present within a plasma, the NF$_3$ gas is excessively activated so as to severely etch the wall made of quarts, i.e., the wall of the pipe 14 for forming plasma and active species.

Further, it is not absolutely necessary for the shower head 70 to have a ring-like structure. For example, pipes having gas holes may be arranged in a lattice shape to form the shower head. Alternatively, a simple gas introducing nozzle can be used in place of the shower head 70.

Further, the embodiment described previously is directed to removal of a native oxide film formed on a silicon substrate. Of course, the present invention can also be employed for removing a native oxide film formed on other substrates or layers. For example, the technique of the present invention can be employed for removing a native oxide film formed on a metal silicide film, e.g., film of WSi$_x$, TiSi$_x$, CoSi$_x$, AlSi$_x$ or NiSi$_x$.

Further, the frequencies of the microwave and RF wave are not limited to those referred to previously. In other words, the microwave and RF wave of different frequencies can also be used in the present invention.

Further, in the embodiment described previously, a native oxide film was removed within the process chamber 16. Of course, it is necessary for at least an oxide film or a native oxide film to be removed within the process chamber 16. However, it is possible to carry out other treatments such as a film-forming treatment and an etching treatment within the process chamber 16 before or after removal of the native oxide film.

Further, in the embodiment described previously, the activated gas flows downward toward a surface of an object. However, it is not absolutely necessary for the activated gas to flow downward in the present invention. For example, it is possible to allow the activated gas to flow laterally, obliquely or upwardly toward a surface of the object.

Still further, in the embodiment described previously, heating lamps arranged below the back surface of a susceptor were used as a heating means for heating an object, which was disposed on the front surface of the susceptor. Alternatively, an electric heater arranged within the susceptor may be used as the heating means. It is also possible to arrange both an electric heater and a cooling means within the susceptor. The cooling means can be used for cooling the susceptor and the object in order to permit the activated gas to be moved to reach a bottom portion of a fine hole such as a contact hole formed in a surface region of the object. Further, heating lamps arranged above the object can be used for directly heating the surface of the object.

It is of no difficulty for those skilled in the art to arrive at various modifications in respect of the features of the present invention described above. Of course, these modifications fall within the technical scope of the present invention. In other words, the technical scope of the present invention is not limited to the typical embodiment described herein in detail. Needless to say, various modifications are conceivable within the technical scope defined in the appended claims.

Figure 8:
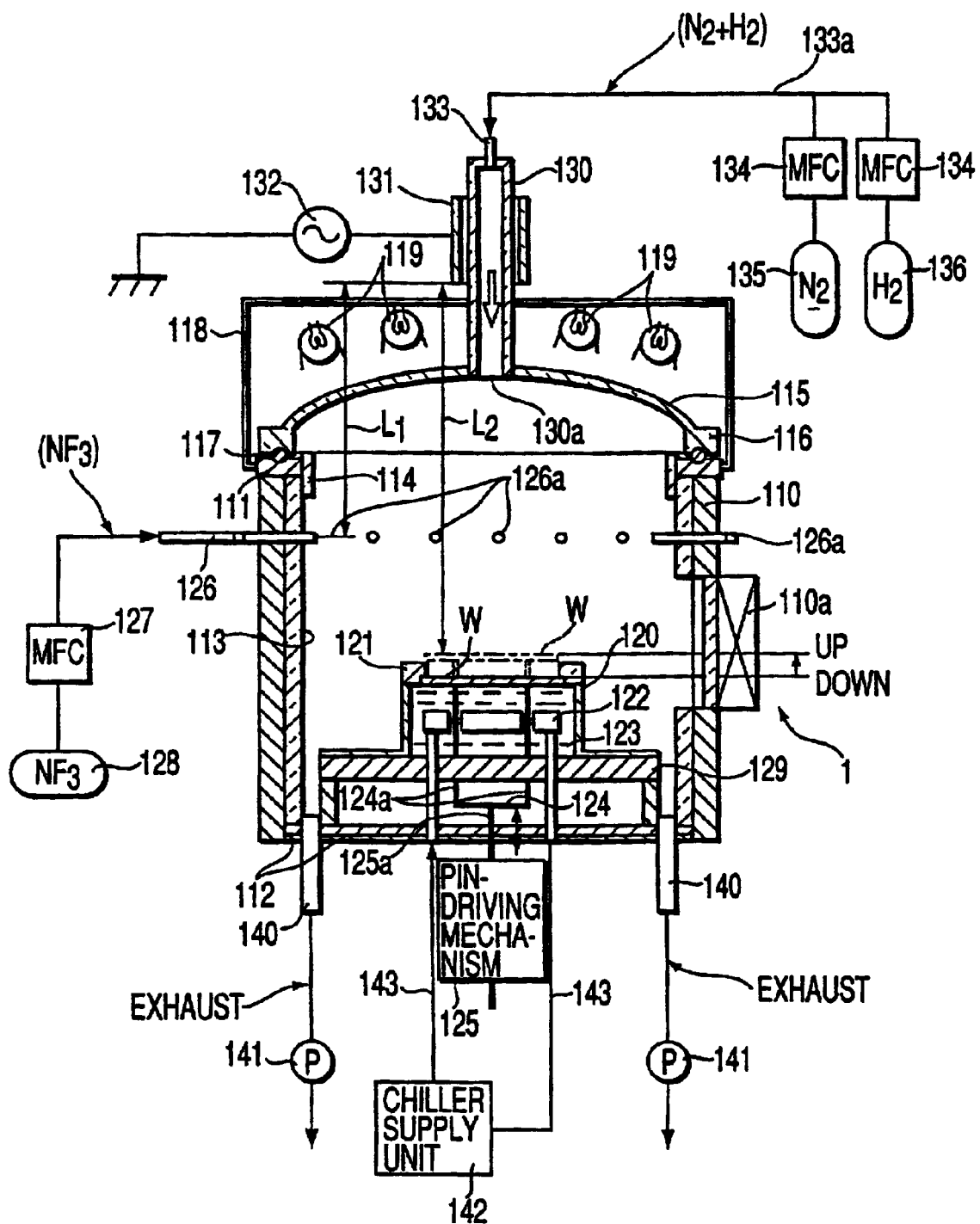
FIG. 8 is a schematic block diagram of a surface treatment apparatus according to another embodiment of the present invention.

FIG. 8 is a conceptual block diagram of a surface treatment apparatus 1 according to another embodiment of the present invention. The apparatus 1 can be used for removing a contaminant having a thickness of 10 Å to 20 Å, which is caused on the surface of a subject to be treated. The contaminant is, for example, a native oxide film or a chemical oxide naturally adhered to or formed on the surface of the subject, and referred to as a native oxide film hereinafter. The subject to be treated is, for example, a semiconductor wafer and referred to as a wafer W hereinafter. As shown in FIG. 8, the surface treatment apparatus 1 comprises a plasma generation pipe 130 for generating plasma from a mixture of N$_2$ and H$_2$ gases and activating the plasma, a treatment vessel 110 for removing the native oxide film from the surface of the wafer W, and a reactive-gas supply pipe 126 for supplying an NF$_3$ gas (reactive gas) from an NF$_3$-gas source into the treatment vessel 110.

The treatment vessel 110 is constituted of aluminum materials and its inner wall is provided with quartz (SiO$_2$) linings 113 and 114 to be protected from metal pollution, erosion or the like. The treatment vessel 110 can be formed as a housing whose transverse plane may have various shapes such as a circle, a square and a polygon. A bottom plate 112 having a predetermined thickness is fixed to the bottom of the treatment vessel 110. A base 129 is disposed on the bottom plate 112, and a cylindrical susceptor 120 is provided on the base 129. The wafer W is placed on the top of the susceptor 120 and clamped by a quartz-made clamp ring 121. A jacket (or a pipe) 122 for holding a chiller and a heat exchanger 123 are included in the susceptor 120. The jacket 122 and heat exchanger 123 can be formed integrally as one component. The chiller is supplied from a chiller supply unit 142 into the jacket 122 through a cooling pipe 143 to cool the wafer W down to a given temperature, such as a temperature not higher than room temperature.

Figure 9A:
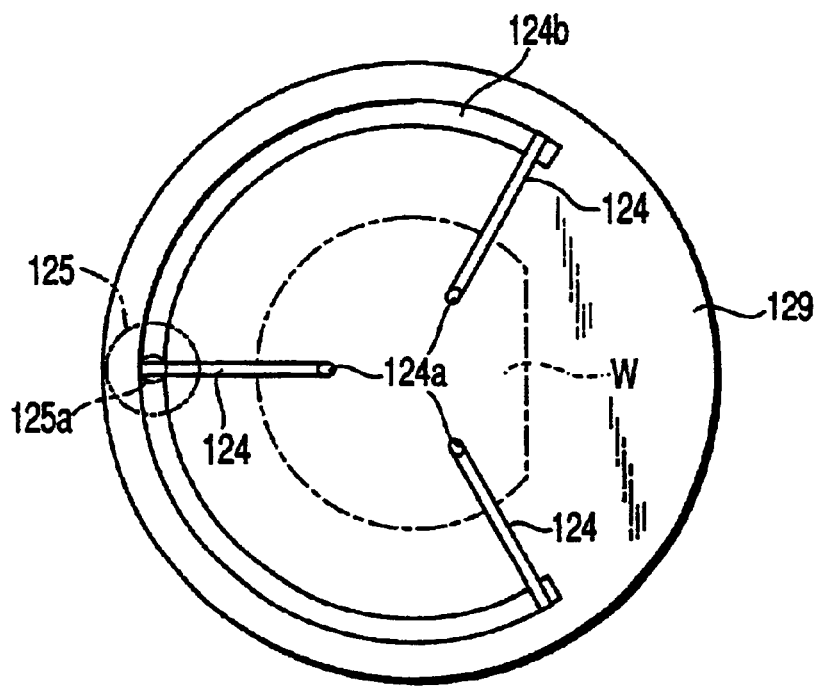
FIG. 9A is a plan view of one example of a wafer lifting mechanism which can be applied to the surface treatment apparatus shown in FIG. 8.
Figure 9B:
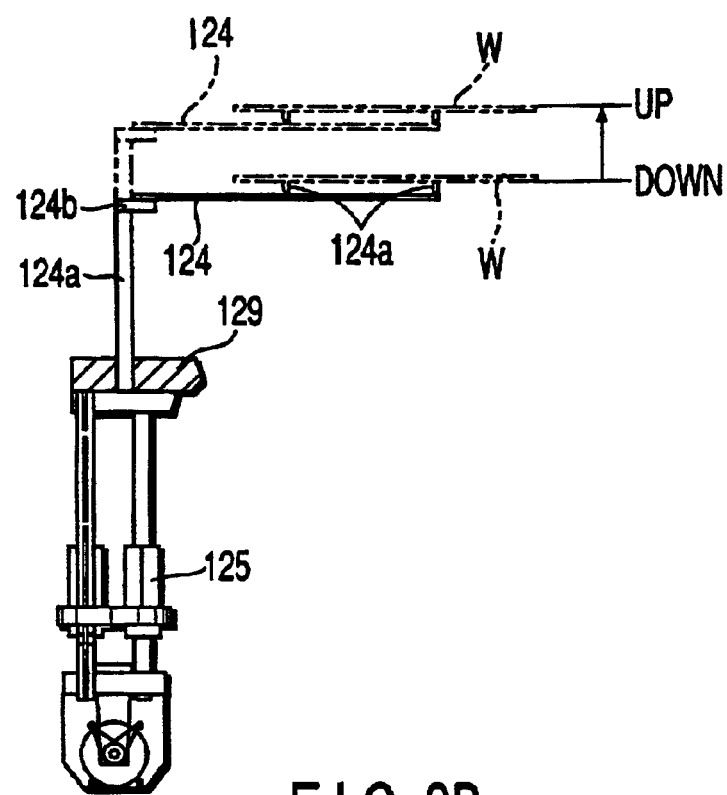
FIG. 9B is a side view of the wafer lifting mechanism illustrated in FIG. 8.

The susceptor 120 is provided with a wafer-lifting means. The wafer-lifting means is a mechanism for lifting the wafer W up to a given heating position (L2) from the susceptor 120 to heat the wafer W, and, after predetermined treatment, lowering the wafer W and returning it on the susceptor 120 and includes a pin-driving mechanism 125, supporting pins 124a, and arms 124. An example of the wafer-lifting means is illustrated in FIGS. 9A and 9B. The pin-driving mechanism (hydraulic cylinder) 125 is disposed under the base 129 formed at the bottom of the treatment vessel 110, and a horseshoe supporting piece 124b is fixed to the end portion of a cylinder rod 125a of the cylinder 125. The arms 124 extend inward along the radial direction of the wafer W, and the supporting pins 124a are fixed to their respective points (three points) of the arms 124. The supporting pins 124a each have an upward-protruding peak portion at one end, and the wafer W is thus held horizontally by these three peak portions of the supporting pins 124a. To heat the wafer W using a heat radiation means (a heating lamp) 119, it is lifted up to the heating position (L2) shown in FIG. 8.

Exhaust pipes (e.g., four exhaust pipes) 140 are arranged on the periphery of the bottom plate 112 fixed to the bottom of the treatment vessel 110. An exhaust means (e.g., a vacuum pump) 141 is connected to these exhaust pipes 140 to evacuate the treatment vessel 110 to produce vacuum.

A top plate 111 (made of, e.g., aluminum materials) is fixed to the top of the treatment vessel 110. A quartz-made cover (dome) 115 having a flange section 116 is formed on the top plate 111, with a sealing member (e.g., a rubber-made O-shaped ring) 117 interposed therebetween. The cover 115 can be formed integrally with the quartz-made plasma generation pipe 130 as one component and may have various shapes such as a flat one and a domed one. Monitor devices such as a pressure sensor can be provided at a sealing section including the sealing member 117. These monitor devices monitor a sealing pressure of the sealing section, a gas leak from the sealing section, and the like.

A number of heating lamps 119 are provided above the cover 115 as a heat radiation means for heating the wafer W from above. As the heating lamps 119, halogen lamps can be employed such that the wafer W can be heated quickly. The heat waves radiated from the heating lamps 119 enter the surface of the wafer W lifted up to the heating position, through the transparent quartz-made dome 115, thereby heating the wafer W up to a temperature of 100° C. or higher (e.g., 120° C.).

Since the heating lamps 119 are covered with a cover 118 made of metal or the like, they can be prevented from radiating heat waves and light rays to the outside and, even when the quartz-made dome 115 is broken, plasma-gas or reactive gas can be prevented from diffusing and leaking to the outside.

A gate valve 110a is provided on the side wall of the treatment vessel 110 to communicate with a carrier chamber, a load-lock chamber, and the like. The gate valve 110a is opened and closed when the wafer W is carried in and out.

Usually the inner surface of the gate valve 110a need not be protected by quartz because the metal surface of the treatment vessel 110 is hardly etched by $NF_3$ gas. Coating of the metal surface with quartz is generally performed in order that the metal surface can prevent the lifetime of species activated by plasma from being shortened. In this sense, it is favorable to coat the inner surface of the gate valve 110a with quartz, too.

The quartz-made plasma generation pipe 130 can be provided in the upper central part of the quartz-made cover 115 integrally with each other by melting contact, and it is opened to the treatment vessel 110 in the center of the cover 115 to introduce plasma into the vessel 110. For generation and introduction of plasma, any structure capable of uniform surface treatment can be adopted. For example, plasma can be introduced from an opening shifted from the center of the cover 115 or from the side of the treatment vessel 110.

An introduction section 133 for introducing a plasma generating gas is connected to the upper end portion of the plasma generation pipe 130. Both $N_2$ and $H_2$ gases are supplied from $N_2$ and $H_2$ gas sources 135 and 136 to a gas passage 133a through a flow-rate controller (MFC) 134. A mixture ($N_2+H_2$) of these gases is supplied to a plasma generation section of the plasma generation pipe 130 inside a plasma cavity 131 through the introduction section 133.

A microwave generator 132 is connected to the plasma cavity 131. A microwave of, e.g., 2.45 GHz, which is generated from the microwave generator 132, is applied to the plasma cavity 131 to excite the plasma generating gas in the plasma generation pipe 130, activate the mixture of $N_2$ and $H_2$ gases, and form active gas species of N* and H* radicals. These active gas species are introduced into the treatment vessel 110 from an opening 130a of the plasma generation pipe 130.

A number of gas exhaust nozzles 126a for supplying an $NF_3$ gas are arranged in position $L_1$ under the opening 130a of the plasma generation pipe 130. The position L1 is at least 20 cm or more, preferably 30 cm or more away from the lower end of the plasma cavity 131 of the plasma generation pipe 130 (plasma generation section). A given amount of $NF_3$ gas is supplied to the gas exhaust nozzles 126a through an $NF_3$-gas source 128, a flow-rate controller (MFC) 127, a conduction pipe 126, a pipe 126b surrounding the outer wall of the treatment vessel 110, and a conduction pipe 126c penetrating the wall of the vessel 110.

Figure 15:
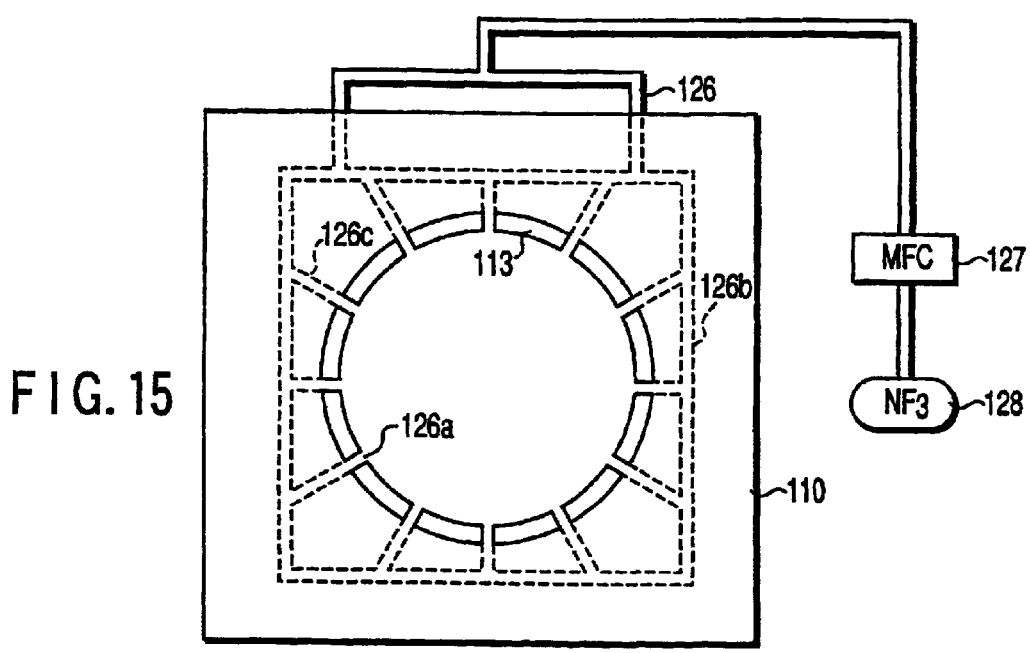
FIG. 15 is a conceptual diagram showing an alternative to an $NF_3$-gas supply section which is applicable to the surface treatment apparatus of the present invention.

The gas exhaust nozzles 126a shown in FIG. 8 are protruded slightly inward from the inner wall of the treatment vessel 110. However, neither the gas exhaust nozzles 126a nor the gas supply section from the conduction pipe 126 to the gas exhaust nozzles 126a is limited to the structure shown in FIG. 8. Another gas supply section is illustrated in FIG. 15. Referring to FIG. 15, a pipe 126b and conduction pipes 126c are provided in the treatment vessel 110 made of aluminum. These pipes 126b and 126c can be formed integrally with the inner wall of the treatment vessel 110. Gas exhaust nozzles 126a are provided so as not protrude from the inner wall of the vessel 110, which allows gas to be diffused uniformly in the treatment vessel 110 and does not disturb a flow of plasma from the upper reaches.

Figure 10A:
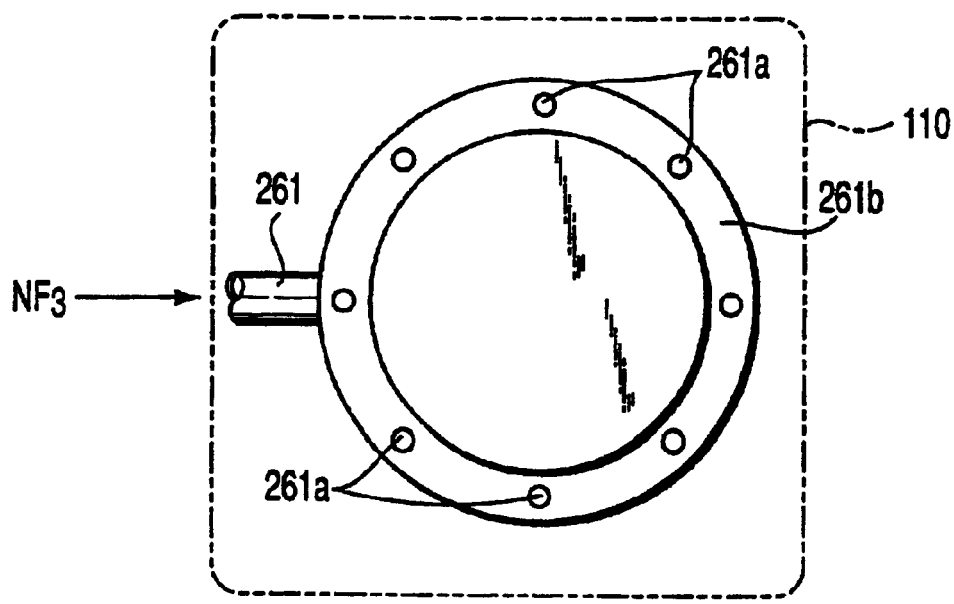
FIG. 10A is a plan view showing a ring-shaped shower head as an alternative to an $NF_3$-gas supply section (shower head) which is applicable to both the treatment apparatuses of FIGS. 1 and 8.

A shower head 261b is illustrated in FIG. 10A as an alternative to the gas exhaust nozzles 126a shown in FIG. 8. The shower head 261b is shaped like a ring and made of quartz. The shower head 261b has a number of gas exhaust nozzles 261a. These nozzles 261a are arranged on the circumference of the shower head 261b so as to be directed in the downward direction (in the direction of the susceptor 120), the lateral direction, or the slanting direction. A conduction pipe 261 is connected to the ring-shaped shower head 261a. The shower head 261a is located horizontally in a given position within the treatment vessel 110 to supply NF$_3$ gas into the treatment vessel 110.

Figure 10B:
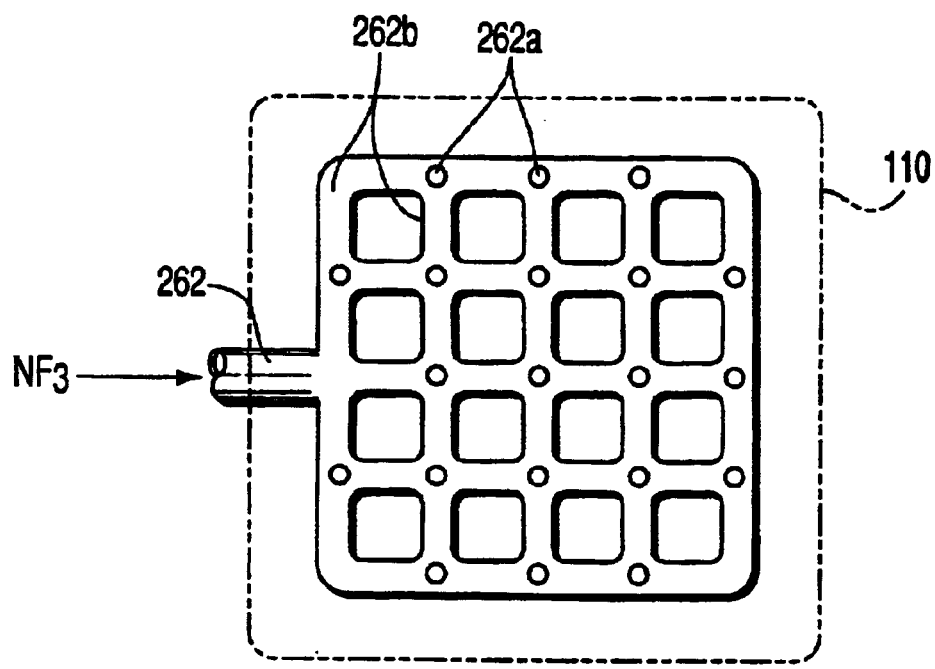
FIG. 10B is a plan view showing a grid-like shower head as an alternative to the $NF_3$-gas supply section which is applicable to both the treatment apparatuses of FIGS. 1 and 8, the grid-like shower head being viewed from a susceptor.

FIG. 10B shows a grid-like shower head 262b having a number of gas exhaust nozzles 262a. In this shower head 262b, too, the gas exhaust nozzles 262a can be arranged in the downward direction, lateral direction, or the slanting direction.

Furthermore, a means (not shown) for regulating the flow of plasma gas can be provided at the opening 130a of the plasma generation tube 130. The regulating means can be formed as a cylindrical or umbrella cover which is opened from the opening 130a toward the susceptor 120.

Figure 11:
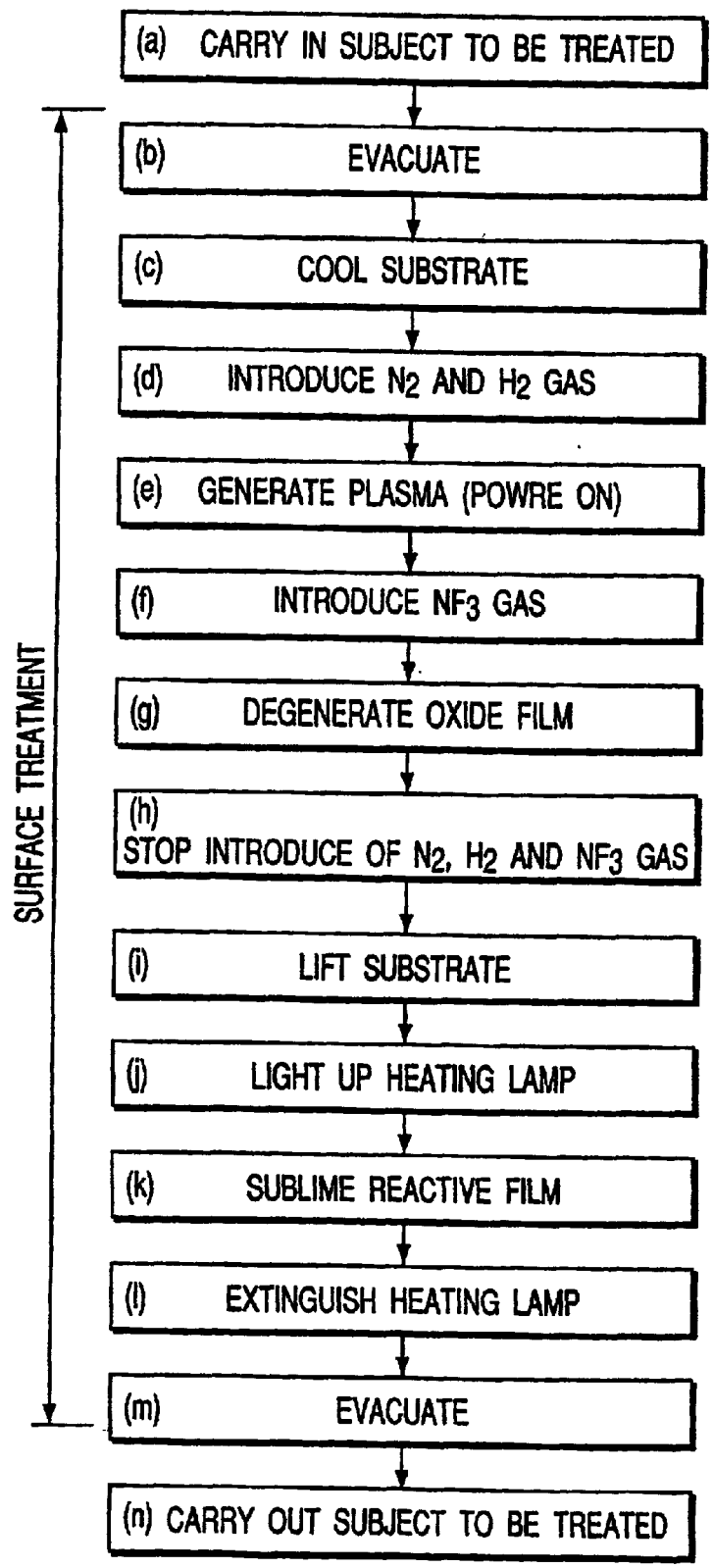
FIG. 11 is a flowchart of respective steps of a surface treatment method according to the present invention.

A method of treating a surface (removing a native oxide film) by the foregoing surface treatment apparatus, will now be described with reference to the flowchart of FIG. 11.

STEP (a)

When the gate valve 110a of the surface treatment apparatus 1 shown in FIG. 8 is opened, a single wafer W is carried from the carrier chamber into the treatment vessel 110 through the gate valve 110a in an unreactive atmosphere (e.g., in a vacuum), placed on the susceptor 120, and clamped to the susceptor 120 by the clamp ring 121. In the preceding step, a contact hole 2 is formed in the wafer W as shown in FIG. 6A, and an oxide 10 such as a native oxide film is formed at the bottom of the contact hole 2 as shown in FIG. 6A.

STEP (b)

After the wafer W is inserted into the treatment vessel 110, the gate valve 110a is closed. The vessel 110 is evacuated through the exhaust pipes 140 by means of the vacuum pump 141 to produce a vacuum atmosphere of 1 mTorr or lower (133 Pa or lower).

STEP (c)

The wafer W is cooled to room temperature or lower by the chiller supplied from the chiller supply unit 142 to the susceptor 120.

STEP (d)

N$_2$ (nitrogen) and H$_2$ (hydrogen) gases are supplied from the N-gas and H-gas sources 135 and 136 to the gas passage 133a, under the control of their flow rates through the flow-rate controller (MFC) 134, to generate a mixture gas (N$_2$+H$_2$), and the mixture gas is then supplied from the plasma gas introduction section 133 to the plasma generation pipe 130 as a plasma generating gas.

STEP (e)

A microwave (2.54 GHz) is generated from the microwave generator 132 and introduced into the cavity formed around the plasma generation section of the plasma generation pipe 130. The microwave causes plasma to be produced from the mixture gas (N$_2$+H$_2$). The plasma is activated to form active gas species of N* and H* radicals. In particular, the H$_2$ gas, which is originally hard to become plasmatic, can be changed into plasma with efficiency and then activated, together with the N$_2$ gas. The active gas species N* and H* are attracted to the vacuum atmosphere in the treatment vessel 110 and caused to flow from the plasma generating section of the pipe 130 toward the opening (outlet) 130a thereof.

STEP (f)

A reactive gas NF$_3$ is supplied from the NF$_3$-gas source 128, provided outside the treatment vessel 110, to the reactive-gas conduction pipe 126 through the flow-rate controller (MFC) 127 and then supplied from the gas exhaust holes 126a into the treatment vessel 110 like a shower. The NF$_3$ gas is added to the active gas species of N* and H* radicals generated by the plasma of N$_2$ and H$_2$ gases flowing from the opening 130a of the plasma generation pipe 130. The added NF$_3$ gas is thus activated by these active gas species N* and H*.

STEP (g)

By the activation of NF$_3$ gas and the synergistic effect of active gas species N* and H*, the native oxide film 10 of the wafer W shown in FIG. 3A is degenerated into a reactive film 82 mixing Si, N, H, F and O, as shown in FIG. 3B. When the native oxide film 10 is degenerated, a chiller (e.g., ethylene glycol) is supplied into the susceptor 120 by the chiller supply unit 142, and the wafer W placed on the susceptor 120 is cooled to not higher than room temperature.

This cooling increases the rate of etching using the NF$_3$ active gas. As process conditions for the above treatment, it is preferable that the flow rates of H$_2$, NF$_3$ and N$_2$ be 10 sccm, 130 sccm and 100 sccm, respectively, process pressure be 3 Torr, plasma power be 50 W, and process time be about 3 minutes.

Since the etching rate of etching species generated by reaction of NF$_3$ and H$_2$ gases is low, these gases are adsorbed by the etching surface to determine the etching rate. If the wafer is cooled down to not higher than room temperature, the above adsorbing rate is increased and so is the etching rate.

Figure 16:
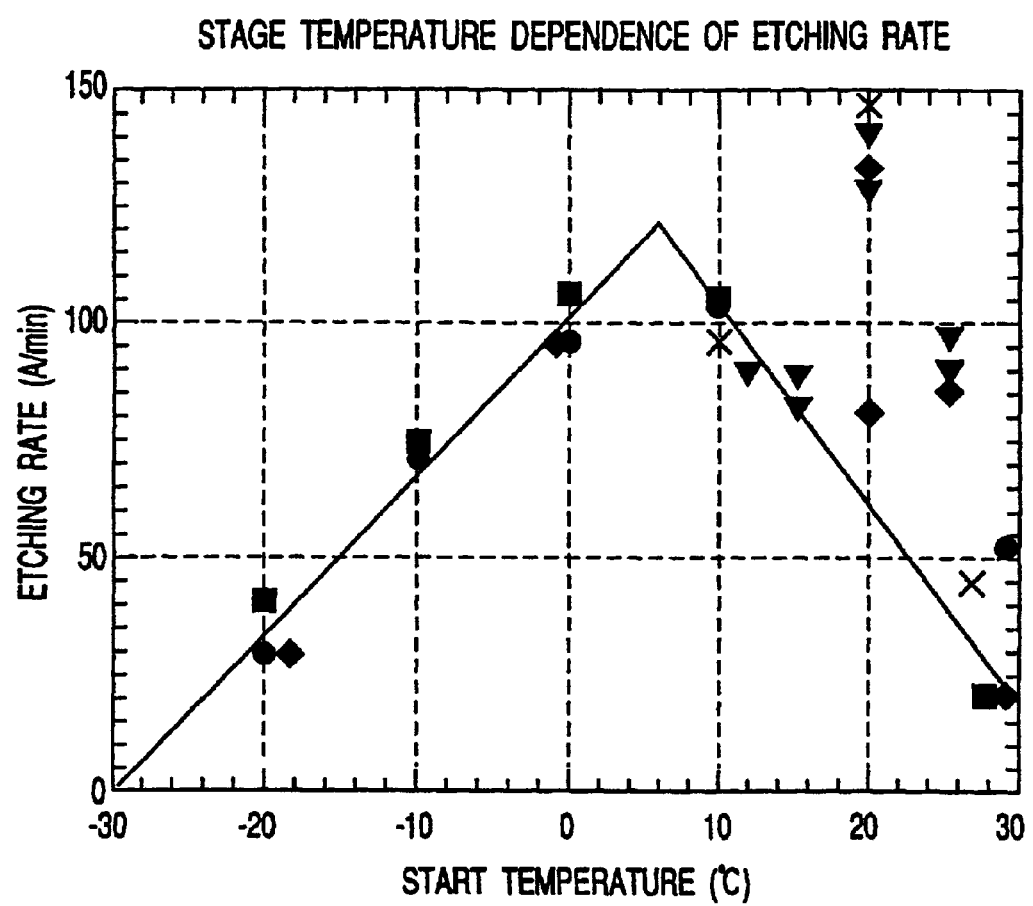
FIG. 16 is a diagram showing a relationship between etching rate and temperature at which the wafer is cooled in the surface treatment apparatus of the present invention.

As described above, it is preferable that the step of degenerating the native oxide film 10 on the wafer W by the activation of NF$_3$ gas and the synergistic effect of active gas species N* and H* be executed at a temperature which is not higher than room temperature. FIG. 16 shows a relationship between cooling temperature and etching rate in the degenerating step with respect to six cases. In this figure, the ordinate indicates the etching rate, while the abscissa does the cooling temperature of the wafer W at the start of the step. As is apparent from FIG. 16, since the control characteristic of etching becomes unstable when the cooling temperature exceeds 20° C. it is preferable that the cooling temperature be not higher than room temperature and range from 20° C. to −20° C. and from 10° C. to −20° C. The data shown in FIG. 16 is obtained under the following experimental conditions: In the step of degenerating the native oxide film 10, ratio of H$_2$/NF$_3$/N$_2$ is 300:60:400 sccm, pressure is 4 Torr, power is 300 W, and process time is 1 minute. In the sublimation step, temperature is 140° C., time is 1 minute, and atmosphere is vacuum.

STEP (h)

After the native oxide film is degenerated, the supply of H$_2$, N$_2$ and NF$_3$ gases is stopped, as is the driving of the microwave generator 132, thereby stopping the introduction of microwaves into the plasma generation pipe 130. The treatment vessel 110 is evacuated through the exhaust pipes 140 to produce vacuum.

STEP (i)

The wafer-lifting means is driven to lift the wafer W up to the heating position at least 5 mm away from the susceptor 120.

STEP (j)

When the heating lamp 119 lights up, the wafer W is heated from above and its surface is quickly heated to a temperature of 100° C. or higher (e.g., 120° C.) from room temperature.

STEP (k)

Figure 3C:
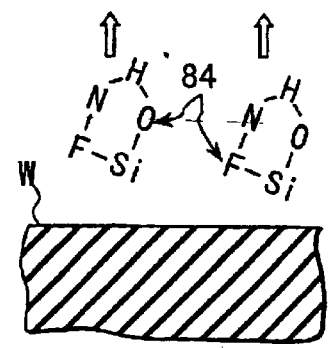

The reactive film 82 mixing Si, N, H, F and O is sublimated as gas 84 mixing Si, N, H, F and O by the heating lamp 119, as shown in FIG. 3C, and then eliminated and exhausted from the exhaust pipes 140. By this sublimation, the native oxide film 10 (reactive film 82) is removed from the wafer W and thus silicon (Si) appears on the surface of the wafer W. As the process conditions for this step, it is preferable that process pressure is 1 mTorr or lower and process time is about 2 minutes.

STEP (l)

The heating lamp 119 is extinguished.

STEP (m)

Finally, the evacuation is stopped.

STEP (n)

The gate valve 110a is opened, and the wafer-lifting means is driven to lower the wafer W and return it on the susceptor 20. The wafer W from which the native oxide film is removed, is taken out of the treatment vessel 110 and carried to its next chamber (e.g., a carrier chamber) in a vacuum atmosphere.

The above oxide film includes not only $SiO_2$ but also W, Ti, Al, Ni and Co and a very thin oxide film (10 Å to 20 Å) grown on silicide of these elements.

The surface treatment apparatus of the present invention constitutes a multi-chamber cluster system in combination with other treatment units such as a metal-wiring forming chamber, a heating chamber, a cooling chamber, a carrier chamber and a load-lock chamber. The constitution of the cluster system will now be described.

Figure 12:
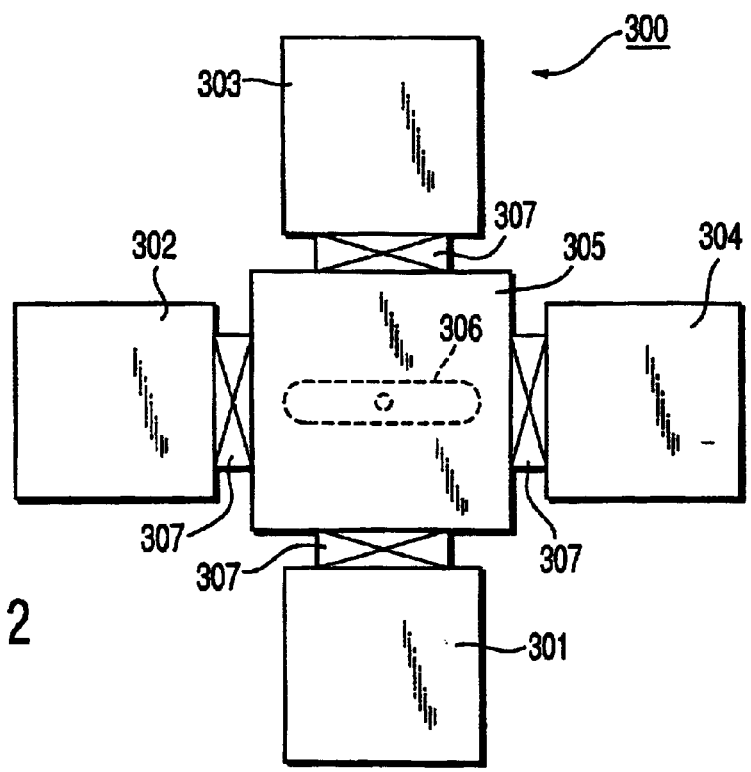
FIG. 12 is a conceptual view of a vacuum cluster system constituted by a combination of a heating unit and a wiring-forming unit when the surface treatment apparatuses shown in FIGS. 1 and 8 are each employed as a native oxide film removing apparatus.

FIG. 12 shows a vacuum cluster system 300 capable of carrying a wafer in an unreactive atmosphere (e.g., a vacuum atmosphere). The system 300 includes a native oxide film removing chamber 301 which corresponds to the surface treatment apparatus of the present invention. A heating chamber 302, at least one metal-wiring forming chamber 303, and a load-lock chamber 304 are connected to the chamber 301 through a carrier chamber 305. The metal-wiring forming chamber 303 forms metal wirings of Al, Ti, TiN, Si, W, WN, Cu, Ta and SiN on a subject to be treated by metal CVD. A gate valve 307 is interposed between adjacent chambers, and a carrier robot 306 is provided in the carrier chamber 305.

A wafer cassette containing wafers is transported into the load-lock chamber 304, and the wafers are carried in the carrier chamber 305 and aligned with reference to their orientation flats. When the gate valve 307 is opened, the carrier robot 306 carries the wafers into the native oxide film removing chamber 301 one by one. In the chamber 301, an oxide film is removed from the surface of each of the wafers, and the wafers are pre-heated in the heating chamber 302. After that, in the metal-wiring forming chamber 303, metal wirings such as Al and Ti are formed in the contact holes of the wafers by metal CVD. Finally, the wafers are returned to the load-lock chamber 304.

Figure 13:
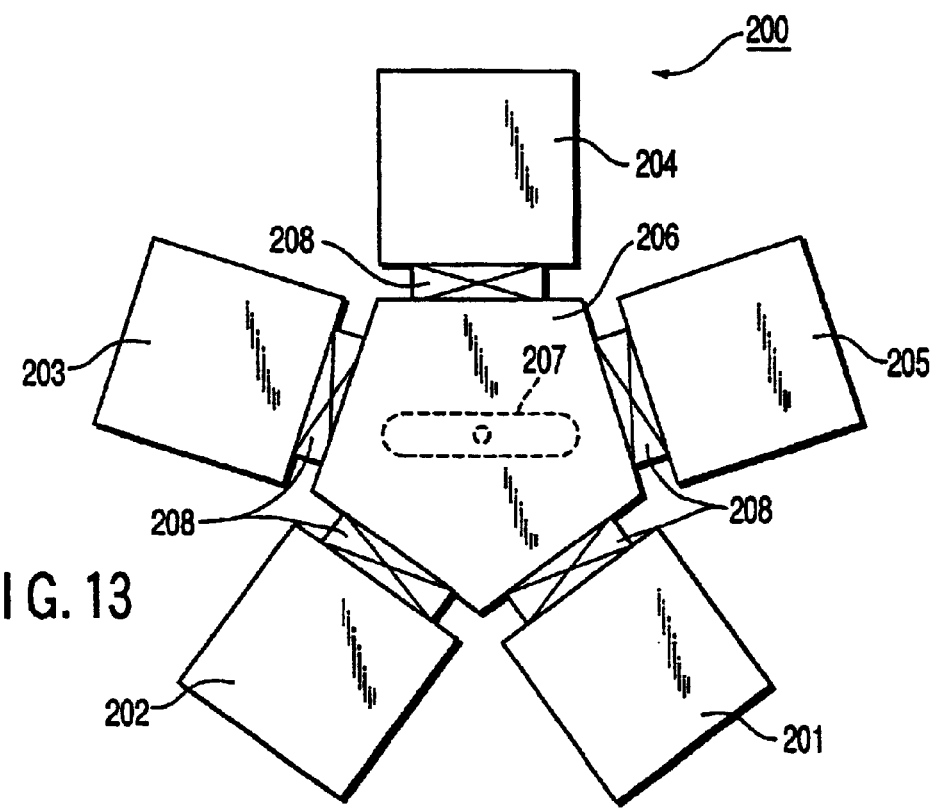
FIG. 13 is a conceptual view of a vacuum cluster system constituted by a combination of a heating unit, a wiring-forming unit and a cooling unit when the surface treatment apparatuses shown in FIGS. 1 and 8 are each employed as a native oxide film removing apparatus.
Figure 14:
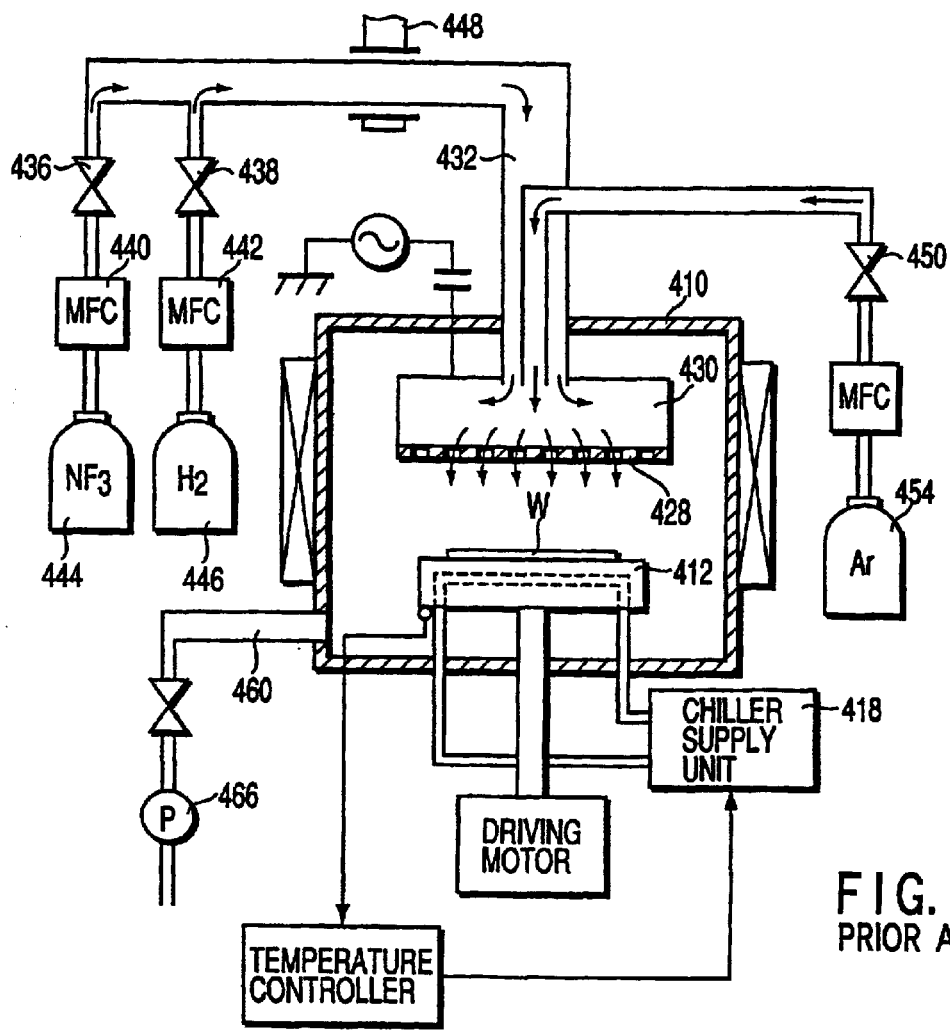
FIG. 14 is a schematic view of a prior art etching apparatus which is applied to a method of removing a native oxide film by etching using a neutral gas species of $NF_3$ and $H_2$ gases.

FIG. 13 illustrates a vacuum cluster system 200 capable of carrying a wafer in an unreactive atmosphere. The system 200 includes a native oxide film removing chamber 201 corresponding to the surface treatment apparatus of the present invention. A heating chamber 202, at least one metal-wiring forming chamber 203, a cooling chamber 204, and a load-lock chamber 205 are connected to the chamber 201 through a carrier chamber 206. A gate valve 208 is interposed between adjacent chambers, and a carrier robot 207 is provided in the carrier chamber 206.

In order to carry the wafers on which metal wirings are formed, from the chamber 203 which is usually heated to a temperature of about 500° C., to the load-lock chamber 205, the wafers need to be cooled to a temperature (about 150° C.) at which the chamber 205 can receive the wafers.

In the vacuum cluster systems shown in FIGS. 12 and 13, if the heating chambers 302 and 202 have a means for heating the wafers to a temperature of 100° C. or higher, the heating means of the native oxide film removing chambers 301 and 201 can be excluded.

The vacuum cluster systems so constituted have the advantages that a native oxide film can be prevented from being regenerated while the wafers are being carried in the atmosphere, time from removal of a native oxide film to deposition need not be controlled, a water mark can be prevented from being produced, a native oxide film can be removed from the wafer in situ, and throughput is greatly improved.

In the above-described surface treatment method and surface treatment apparatus according to the present invention, gas containing N and H is activated as plasma gas to form an active gas species. The active gas species activates a reactive gas ($NF_3$ gas) and cools a subject to be treated to not higher than room temperature. These three gases are reacted with an oxide film formed on the surface of the subject to degenerate the oxide film into a reactive film. If the reactive film is sublimated by heating, the oxide film such as a native oxide film can be removed from the surface of the subject with high efficiency and at a high etching rate.

In the foregoing embodiment, $N_2$ and $H_2$ gases are employed as a gas containing N and H. This gas can be replaced with another gas such as ammonium.

Furthermore, the shower head for jetting an activated gas is shaped like a ring or a grid. However, any other structure can be adopted for the shower head.

The surface treatment apparatus of the present invention and other treatment apparatuses constitute a cluster system capable of carrying a subject to be treated in an unreactive atmosphere or in a vacuum. Therefore, no oxide film is formed on a wafer while the wafer is being carried, and the system throughput is enhanced as a whole.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A surface treatment apparatus comprising:

a plasma generation section adapted for generating plasma from a plasma generating gas;

a treatment vessel connected to the plasma generation section and including a susceptor adapted for placement of a subject to be treated thereon;

a cooling device adapted for cooling the subject placed on the susceptor;

a supply section adapted for adding a reactive gas to an activated plasma generating gas activated by the plasma generation section and caused to flow toward the subject cooled by the cooling device;

a heating device adapted for heating a product produced by a reaction between the activated reactive gas and the surface layer of the subject, and a separating device adapted for separating the substrate from the susceptor prior to heating the product.

2. The surface treatment apparatus according to claim 1, which is an apparatus for removing a native oxide film from a surface of the subject to be treated.

3. The surface treatment apparatus according to claim 2, wherein the plasma generating section is adapted for generating plasma from a plasma generating gas which contains an H2 gas and the supply section is adapted for supplying a reactive gas which contains a fluorine-containing gas.

4. The surface treatment apparatus according to claim 3, wherein the fluorine-containing gas is an NF3 gas.

5. The surface treatment apparatus according to claim 3, wherein the plasma generating gas contains an N2 gas.

6. A cluster system comprising:

the surface treatment apparatus according to claim 2;

a carrier chamber in which a carrier robot for carrying the subject is provided connected to the treatment vessel of the surface treatment apparatus;

and a metal-wiring forming chamber connected to the transfer chamber, wherein the cluster system is capable of carrying the subject in an unreactive atmosphere such that a native oxide film can be prevented from being regenerated while the subject is being carried in the atmosphere.

7. A cluster system according to claim 6, further comprising:

a load lock chamber connected to the carrier chamber, a heating chamber, connected to the carrier chamber, for pre-heating the subject to be treated; and a cooling chamber connected to the carrier chamber.

8. The surface treatment apparatus according to claim 6, wherein the metal-wiring forming chamber is a chamber adapted for forming a film of at least one of Al, Ti, TIN, Si, W, WN, Cu, Ta, TaN and SiN.

9. The surface treatment apparatus according to claim 6, wherein the metal-wiring forming chamber includes means for heating the subject to a temperature of 100° C. or higher.

10. The surface treatment apparatus according to claim 1, wherein the cooling device is adapted for reaching a predetermined temperature of not higher than room temperature.

11. The surface treatment apparatus according to claim 1, wherein the cooling device is adapted for reaching a predetermined temperature which ranges from 20° C. to −20° C.

12. The surface treatment apparatus according to claim 1, wherein the cooling device is adapted for reaching a predetermined temperature which ranges from 10° C. to −20° C.

13. The surface treatment apparatus according to claim 1, wherein the heating device is adapted for reaching a heating temperature of not lower than 100° C.

14. The surface treatment apparatus according to claim 1, wherein the heating device is heat radiation means provided above the subject to be treated.

15. The surface treatment apparatus according to claim 1, wherein the heating device is a heating lamp provided above the subject to be treated.

16. The surface treatment apparatus according to claim 1, wherein the separating device is a lifting device for lifting the subject to be treated, to move the subject away from the susceptor when heating the product with the heating device.

17. The surface treatment apparatus according to claim 1, wherein the supply section includes a number of gas exhaust holes formed in an inner wall of the treatment vessel.

18. The surface treatment apparatus according to claim 1, wherein the supply section includes a shower bead having a number of gas exhaust holes provided in the treatment vessel.

19. The surface treatment apparatus according to claim 1, wherein the supply section is adapted for supplying the reactive gas to the activated plasma generating gas in position at least 20 cm away from an end of the plasma generation section in a direction of the subject to be treated.

* * * * *